(12) United States Patent
Tsuboi et al.

(10) Patent No.: US 7,099,066 B2
(45) Date of Patent: Aug. 29, 2006

(54) MICROMIRROR UNIT AND METHOD OF MAKING THE SAME

(75) Inventors: Osamu Tsuboi, Kawasaki (JP); Satoshi Ueda, Kawasaki (JP); Yoshihiro Mizuno, Kawasaki (JP); Ippei Sawaki, Kawasaki (JP); Fumio Yamagishi, Kawasaki (JP)

(73) Assignees: Fujitsu Limited, Kawasaki (JP); Fujitsu Media Devices Limited, Suzaka (JP)

( * ) Notice: Subject to any disclaimer, the term of this patent is extended or adjusted under 35 U.S.C. 154(b) by 0 days.

(21) Appl. No.: 11/082,881

(22) Filed: Mar. 18, 2005

(65) Prior Publication Data

US 2005/0162730 A1 Jul. 28, 2005

Related U.S. Application Data

(62) Division of application No. 09/950,710, filed on Sep. 13, 2001, now Pat. No. 6,887,396.

(30) Foreign Application Priority Data

Apr. 26, 2001 (JP) ............................. 2001-129596

(51) Int. Cl.
 *G02B 26/00* (2006.01)
(52) U.S. Cl. ...................... 359/291; 359/290; 359/223
(58) Field of Classification Search ................ 359/291, 359/290, 223, 224, 295, 298
 See application file for complete search history.

(56) References Cited

U.S. PATENT DOCUMENTS

| 5,444,566 | A | * | 8/1995 | Gale et al. ................... 359/291 |
|---|---|---|---|---|
| 6,229,640 | B1 | | 5/2001 | Zhang ......................... 359/290 |
| 6,232,861 | B1 | | 5/2001 | Asada ......................... 335/222 |
| 6,392,220 | B1 | | 5/2002 | Slater et al. ................. 250/216 |
| 6,450,702 | B1 | * | 9/2002 | Komoriya et al. ............. 385/90 |
| 6,914,710 | B1 | * | 7/2005 | Novotny et al. ............. 359/291 |

FOREIGN PATENT DOCUMENTS

| JP | 7-287177 | 10/1995 |
|---|---|---|
| JP | 9-146032 | 6/1997 |
| JP | 9-146034 | 6/1997 |
| JP | 10-62709 | 3/1998 |
| JP | 2000-13443 | 1/2000 |

* cited by examiner

*Primary Examiner*—Timothy Thompson
(74) *Attorney, Agent, or Firm*—Bingham McCutchen LLP

(57) ABSTRACT

A method is provided for making a micromirror unit which includes a frame, a mirror forming base, and bridges connecting the frame to the mirror forming base. The method includes the following steps. First, a first mask pattern is formed on a substrate for masking portions of the substrate which are processed into the frame and the mirror forming base. Then, a second mask pattern is formed on the substrate for masking portions of the substrate which are processed into the bridges. Then, the substrate is subjected to a first etching process with the first and the second mask patterns present as masking means. Then, the second mask pattern is removed selectively. Then, the substrate is subjected to a second etching process with the first mask pattern present as masking means. Finally, the first mask pattern is removed.

9 Claims, 12 Drawing Sheets

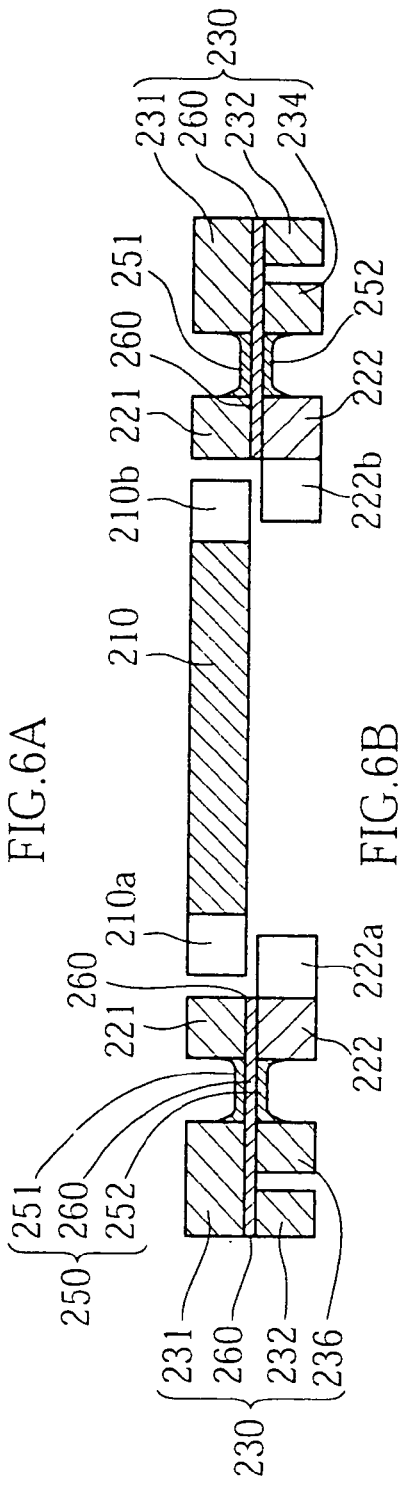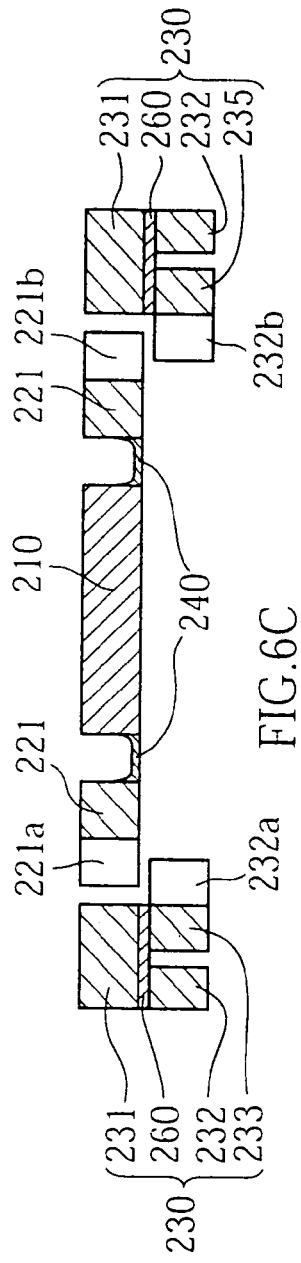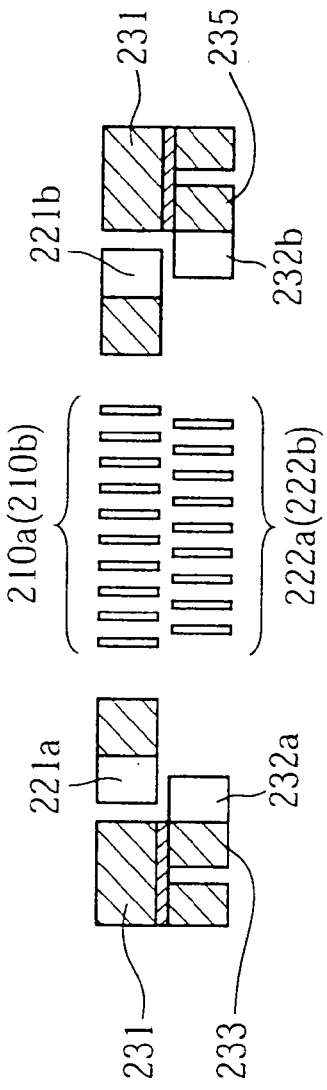

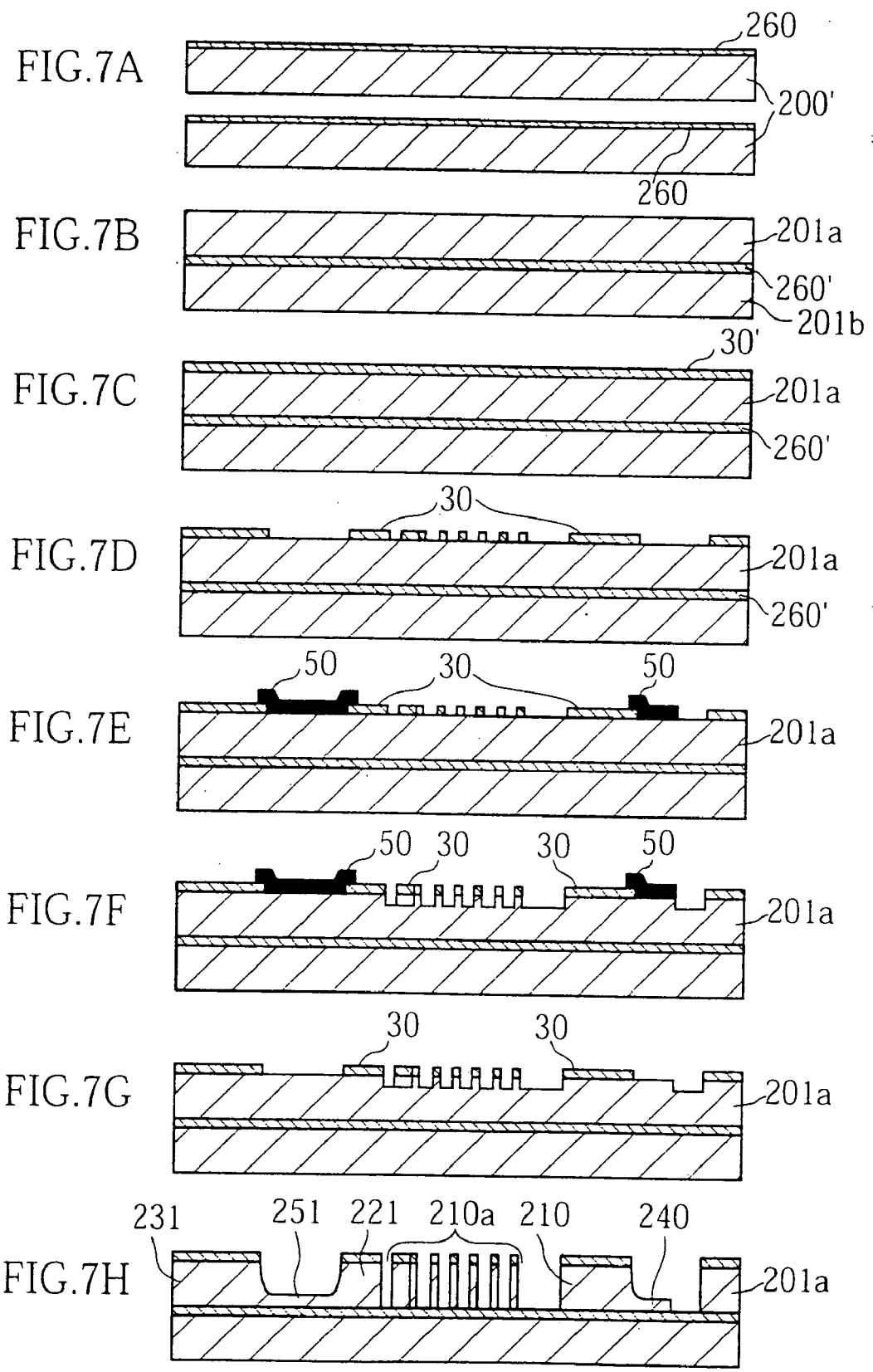

MICROMIRROR UNIT AND METHOD OF MAKING THE SAME

CROSS-REFERENCE TO RELATED APPLICATION

This application is a divisional application of U.S. Ser. No. 09/950,710, filed Sep. 13, 2001 now U.S. Pat. No. 6,887,396, the entire contents of which is incorporated herein by reference.

BACKGROUND OF THE INVENTION

1. Field of the Invention

The present invention relates to a micromirror unit used in optical apparatus for the purposes of changing the direction of light. In particular, it relates to a micromirror unit of the type which is advantageously incorporated in an optical disk apparatus (for writing to or reading data from an optical disk), an optical switching apparatus (for selectively connecting one optical fiber to another to provide a light passage), etc. The present invention also relates to a method of making such a micromirror unit.

2. Description of the Related Art

A micromirror unit is provided with a reflective mirror member which is pivotable for changing the direction of reflected light. A popular technique for actuating the mirror member is to utilize electrostatic force. Micromirror units of this type (referred to as "static driving type" hereinafter) may have several structures. Such micromirror units are generally classified into two groups, depending on fabrication methods. One of the methods employs a "surface micro-machining" technique, whereas the other employs a "bulk micro-machining" technique. In accordance with the surface micro-machining, patterned material layers in lamination may be formed on a base substrate, thereby providing required components such as a support, a mirror member and electrodes. In this layer forming process, a dummy layer, which will be removed later, may also be formed on the substrate. In accordance with the bulk micro-machining, on the other hand, a base substrate itself is subjected to etching, thereby providing required components such as a frame and a mirror forming base. Then, a mirror member and electrodes may be formed on the etched substrate by a thin-film forming technique. A conventional micromirror unit of the static driving type by the surface micro-machining is disclosed in JP-A-7 (1995)-287177 for example. Other micromirror units of the static driving type by the bulk micro-machining are disclosed in JP-A-9 (1997)-146032, JP-A-9 (1997)-146034, JP-A-10 (1998)-62709 and JP-A-2000-13443.

One of the technically significant factors desired in a micromirror unit is a high flatness of the reflective mirror member. According to the above-mentioned surface micro-machining technique, however, the thickness of the resulting mirror member is rendered very small, so that the mirror member is liable to warp. To avoid this and ensure a high flatness, the mirror member should be made so small that its respective edges are less than 100 µm in length. In accordance with the bulk micro-machining, on the other hand, a rather thick substrate is processed, thereby providing a sufficiently rigid mirror forming base to support the mirror member. Thus, a relatively large mirror member having a high flatness can be obtained. Due to this advantage, the bulk micro-machining technique is widely used to fabricate a micromirror unit having a large mirror member whose edges are more than 100 µm in length.

FIG. 10 of the accompanying drawings shows an example of conventional micromirror unit fabricated by the bulk micro-machining technique. The illustrated micromirror unit 300 is of the static driving type, and includes a lamination of a mirror substrate 310 and an electrode substrate 320. As shown in FIG. 11, the mirror substrate 310 includes a mirror forming base 311 and a frame 313. The mirror forming base 311 has an obverse surface upon which a mirror member 311a is formed. The mirror forming base 311 is supported by the frame 313 via a pair of torsion bars 312. The mirror forming base 311 has an reverse surface upon which a pair of electrodes 314a and 314b is formed. As shown in FIG. 10, the electrode substrate 320 is provided with a pair of electrodes 321a and 321b which faces the above-mentioned pair of electrodes 314a and 314b of the mirror forming base 311.

With the above arrangement, the electrodes 314a, 314b of the mirror forming base 311 maybe positively charged, whereas the electrode 321a of the electrode substrate 320 may be negatively charged. As a result, an electrostatic force is generated between these electrodes, thereby turning the mirror forming base 311 in the N3-direction shown in FIG. 10 as the torsion bars 312 are being twisted. To rotate the mirror forming base 311 in the opposite direction, the other electrode 321b of the substrate 320 may be negatively charged. As readily understood, when the mirror forming base 311 is turned clockwise or counterclockwise, as required, the light reflected on the mirror member 311a is directed in the desired direction.

The conventional mirror substrate 310 is prepared by performing wet etching on a mother substrate (not shown) from one side of the substrate. Accordingly, two identical openings 315 (see FIG. 11) are formed to extend through the thickness of the substrate. Each of the openings 315 has a angular C-like configuration and is arranged in symmetrical facing relation to the other. It should be noted here that the geometry of the mirror substrate 310 is provided only by an etching process.

While the conventional micromirror unit is functional in many respects, it still suffers the following drawback.

When the mirror forming base 311 of the micromirror unit 300 is caused to turn, the rotation angle of the mirror forming base 311 is determined so that the electrostatic force generated between the relevant electrodes balances the restoring force of the twisted torsion bars 312. Therefore, in order to accurately reflect light in a desired direction by the micromirror unit 300, it is necessary to design the respective torsion bars 312 in a manner such that they will exert a prescribed restoring force at a given rotation angle of the mirror forming base 311.

According to the prior art, however, the thickness t1 of each torsion bar 312 is rendered equal to the thickness t2 of the mirror forming base 311. Unfavorably, this design may make it difficult or even impossible to provide each torsion bar 312 with a desired characteristics of torsional resistance against the mirror forming base 311.

According to the prior art, however, the thickness t1 of each torsion bar 312 is rendered equal to the thickness t2 of the mirror forming base 311. Unfavorably, this design may make it difficult or even impossible to provide each torsion bar 312 with a desired characteristics of torsional resistance against the mirror base 311.

SUMMARY OF THE INVENTION

The present invention has been proposed under the circumstances described above. It is, therefore, an object of the present invention to provide a micromirror fabrication method which allows the torsion bars to be made in a wider variety of configurations. Another object of the present invention is to provide a micromirror unit fabricated by such a method.

According to a first aspect of the present invention, a method is provided for making a micromirror unit which includes a frame, a mirror forming base, and bridges connecting the frame to the mirror forming base. The method includes the steps of: forming a first mask pattern on a substrate for masking portions of the substrate which are processed into the frame and the mirror forming base; forming a second mask pattern on the substrate for masking portions of the substrate which are processed into the bridges; subjecting the substrate to a first etching process with the first and the second mask patterns present as masking means; removing the second mask pattern selectively; subjecting the substrate to a second etching process with the first mask pattern present as masking means; and removing the first mask pattern.

The bridges include torsion bars about which the mirror forming base is turned relative to the frame. According to the above method, the torsion bars can be made smaller in thickness than the frame or the mirror forming base. In addition to such torsion bars, the bridges may further include temporary support beams connecting the mirror forming base to the frame. The support beams are provided for preventing unduly great stress concentration from occurring in the torsion bars during the fabrication process of the micromirror unit. To finish a micromirror unit, the support beams need to be removed.

According to the above method, the thickness of the torsion bar can be arbitrarily smaller than that of the mirror forming base. Of course, the width of the torsion bar is also adjustable, as in the prior art devices. In this manner, the design variations for the torsion bar are advantageously increased. Thus, as compared to the prior art, it is much easier to provide the resulting torsion bar with a desired configuration and therefore a desired rigidity against twisting.

Preferably, at least one of the first etching process and the second etching process may be performed by dry etching. Advantageously, Deep RIE (reactive ion etching) is employed. Deep RIE improves the production efficiency of the micromirror unit since the etching speed is high.

According to a second aspect of the present invention, a micromirror unit is provided. This unit includes a frame, a mirror forming base, and a torsion bar connecting the frame to the mirror forming base. The torsion bar is made smaller in thickness than the frame and the mirror forming base. The frame, the mirror forming base and the torsion bar are formed as a one-piece component by a common conductive material.

Since the frame, the mirror forming base and the torsion bar are made of the same conductive material, there is no need to layer a separate current passage on the surface of the torsion bar.

Conventionally, in order to apply a driving potential to the mirror forming base, some electrodes need to be provided on the mirror forming base. In addition, a current passage (wiring pattern) needs to be formed on the surface of the torsion bar for connecting the electrodes on the mirror forming base to external terminals. However, when the torsion bar is made smaller in width or thickness, it may be difficult or even impossible to form a current passage on the torsion bar. According to the second aspect of the present invention, this problem is overcome by making the torsion bar of a conductive material to allow the passage of current.

Preferably, the torsion bar may have a first end portion connected to the frame and a second end portion connected to the mirror forming base, wherein the first end portion is made progressively greater in thickness toward the frame, while the second end portion is made progressively greater in thickness toward the mirror forming base. With such a structure, it is possible to alleviate the otherwise problematic stress concentration at the end portions of the torsion bars.

Preferably, the mirror forming base may be provided with first comb-teeth electrodes, and the frame may be provided with second comb-teeth electrodes for generating electrostatic force in cooperation with the first comb-teeth electrodes to move the mirror forming base. Advantageously, the first comb-teeth electrodes may be accommodated in a space equal in thickness to the mirror forming base, and the second comb-teeth electrodes may be accommodated in a space equal in thickness to the frame. According to the present invention, the micromirror unit may further include a counterpart base facing the mirror forming base. In this case, instead of the above-mentioned comb-teeth electrodes, the counterpart base may be provided with a first flat electrode facing the mirror forming base. Correspondingly, the mirror forming base may be provided with a second flat electrode facing the first flat electrode on the counterpart base. When the mirror forming base is made of a conductive material, the second flat electrode may be omitted.

Preferably, the micromirror unit of the present invention may further include a second frame arranged outward of the first frame and a second torsion bar connecting the second frame to the first frame, wherein the second torsion bar is elongated in a direction perpendicular to another direction in which the first torsion bar is elongated. In this case, the micromirror unit is called a "biaxial type." In the biaxial type micromirror unit, the first frame may be provided with third comb-teeth electrodes, and the second frame may be provided with fourth comb-teeth electrodes for generating electrostatic force in cooperation with the third comb-teeth electrodes to move the first frame.

Preferably, the frame, the mirror forming base or the torsion bars may include a first conductive layer, a second conductive layer and an insulating layer sandwiched between the first and the second conductive layers. Further, the micromirror unit of the present invention may further include a plurality of islands insulated from each other by an insulating layer or clearance.

Other features and advantages of the present invention will become apparent from the detailed description given below with reference to the accompanying drawings.

BRIEF DESCRIPTION OF THE DRAWINGS

FIGS. 6A–6C are sectional views showing the micromirror unit of FIGS. 5;

FIGS. 7A–7M are sectional views illustrating some of the steps of a fabrication process of the micromirror unit of FIGS. 5A and 5B, taken along lines E—E in FIGS. 5.

DETAILED DESCRIPTION OF THE PREFERRED EMBODIMENT

The preferred embodiments of the present invention will be described below with reference to the accompanying drawings.

Figure 1:
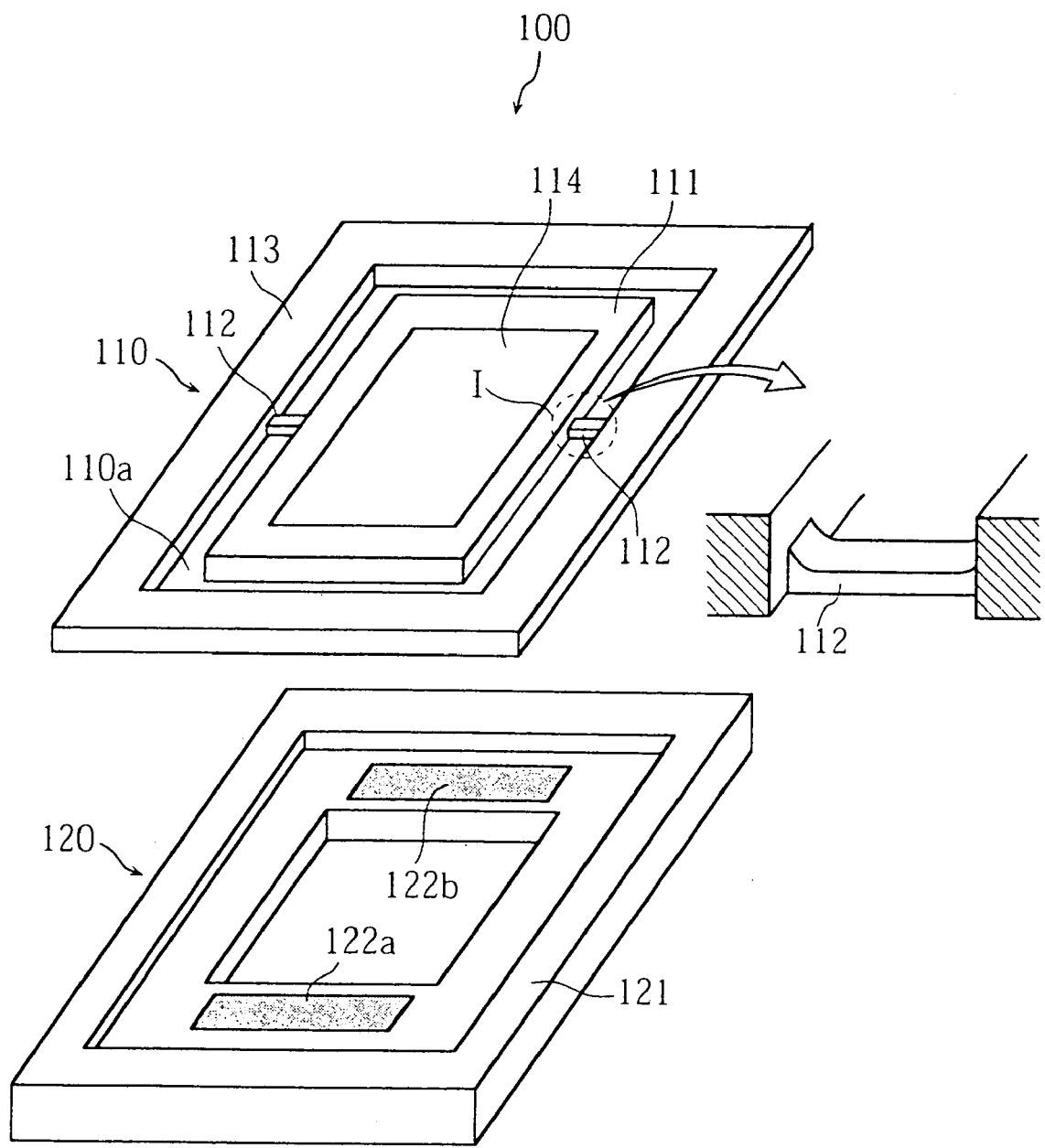
FIG. 1 is an exploded view showing a micromirror unit according to a first embodiment of the present invention.
Figure 2:
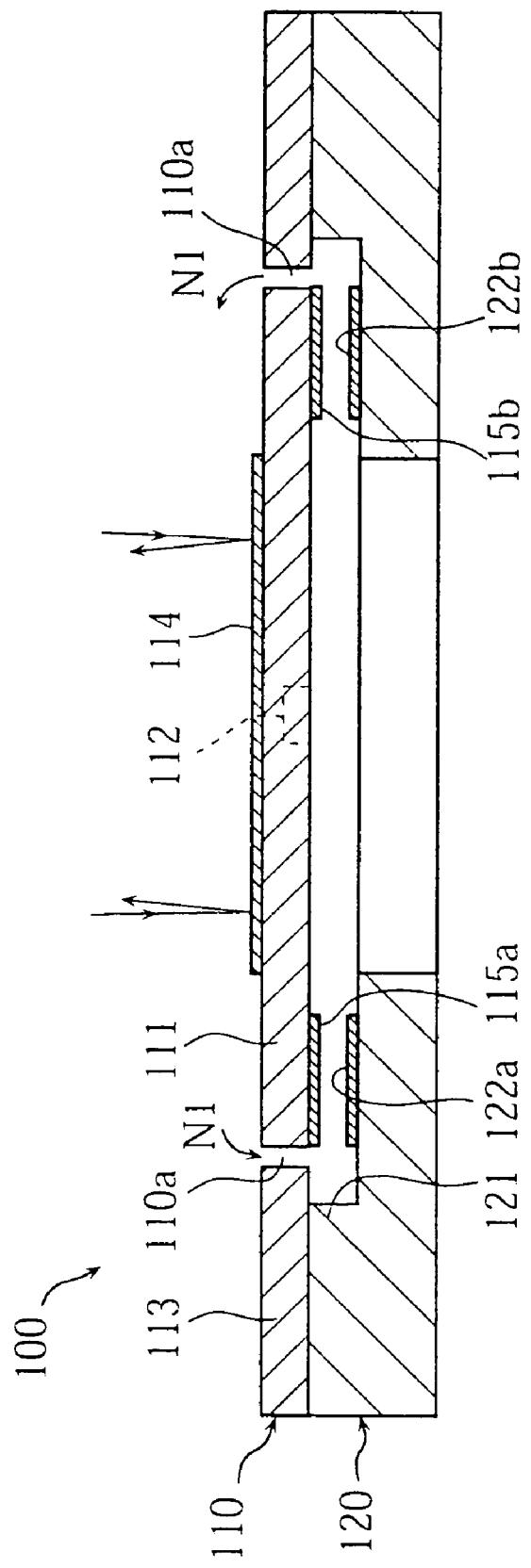
FIG. 2 is a sectional side view showing the assembled state of the micromirror unit of FIG. 1.

FIGS. 1 and 2 show a micromirror unit 100 according to a first embodiment of the present invention. The illustrated unit 100 is a "static driving type" device, and includes two superposed substrates, i.e., a mirror substrate 110 and an electrode substrate 120. The mirror substrate 110 is made of a conductive silicon material doped with n-type impurity. The fabrication method of the mirror substrate 110 will be described later. The mirror substrate 110 is formed with a pair of openings 110a extending through the thickness of the substrate. The paired openings 110a define a mirror forming base 111. As seen from FIG. 1, the mirror forming base 111 has a generally rectangular configuration having a larger dimension (length) and a smaller dimension (width). The mirror substrate 110 also includes a frame 113 which encloses the mirror forming base 111 via the openings 110a. The frame 113 has a generally rectangular profile having a length and a width. The mirror forming base 111 is connected to the frame 113 via a pair of torsion bars 112. As seen from FIG. 1, the two torsion bars 112 are aligned with each other, so that they have a common axis. This makes the micromirror unit 100 a uniaxial type device.

As shown in FIG. 2, the obverse surface of the mirror forming base 111 is provided with a mirror member 114, while its reverse surface is provided with a pair of electrodes 115a, 115b. The mirror member 114 and the electrodes 115a, 115b may be made by vapor deposition of metal. The width of each opening 110a may be 10–200 μm. The thickness of the mirror forming base 111 maybe 10–200 μm. The electrodes 115a, 115b maybe omitted when the conductivity of the mirror substrate 110 is sufficiently high.

As shown in FIG. 1, each of the torsion bars 112 connects, at one end, to the center of a longitudinal side surface of the mirror forming base 111, while also connecting, at the other end, to the center of an inner longitudinal side surface of the frame 113. Each torsion bar 112, as a whole, is smaller in thickness than the mirror forming base 111. The bottom surface of the torsion bar 112 is flush with the reverse surface of the mirror forming base 111 (see also FIG. 2). The upper surface of the torsion bar 112 is retreated from the obverse surface of the mirror forming base 111 or frame 113. The torsion bar 112 is made greater in thickness as one proceeds toward the both ends from the center of the bar.

The frame 113 of the mirror substrate 110 is attached to the upwardly protruding rim 121 of the electrode substrate 120. The electrode substrate 120 is provided with a pair of electrodes 122a, 122b which face the electrodes 115a, 115b of the mirror forming base 111. This makes the micromirror unit 100 a "parallel plate type" device.

With the above arrangement, the electrodes 115a, 115b of the mirror forming base 111 may be positively charged, while the electrode 122a of the electrode substrate 120 may be negatively charged. As a result, an electrostatic force is generated between these electrodes, thereby turning the mirror forming base 111 in the N1-direction against the restoring force of the twisted torsion bars 112. To turn the mirror forming base 111 in the opposite direction, the electrode 122b may be negatively charged. As the mirror forming base 111 is turned clockwise or counterclockwise, the light reflected on the mirror member 114 can be directed in a desired direction. The positive potential is applied to the electrodes 115a, 115b of the mirror forming base 111 via the frame 113, torsion bars 112 and mirror forming base 111, all of which are made of conductive material. The negative potential is applied to the electrodes 122a, 122b of the electrode substrate 120 via a wiring pattern (not shown) formed on the electrode substrate 120, which is made of insulating material.

Referring now to FIGS. 3A–3F and 4A–4F, a fabrication process of the micromirror unit 100 will be described below. FIGS. 3A–3F are perspective views showing the principal steps of the fabrication process of the micromirror unit 100. FIGS. 4A–4F are sectional views corresponding to the steps of FIGS. 3A–3F, respectively. Precisely, each of these sectional views is taken along the lines IV—IV in the corresponding one of FIGS. 3A–3F (for simplicity, the section lines are depicted only in FIG. 3A).

Figure 3A:
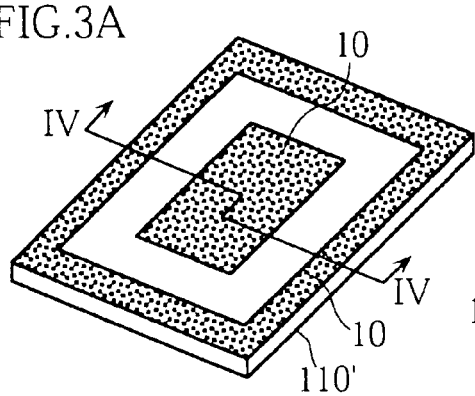
FIGS. 3A–3F are perspective views illustrating some of the steps of a fabrication process of the micromirror unit of the present invention.
Figure 4A:
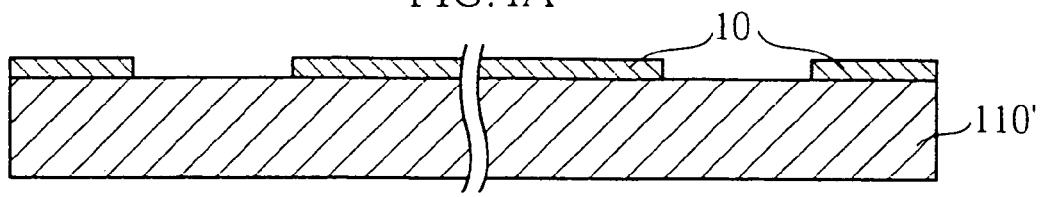
FIGS. 4A–4F are sectional views corresponding to FIGS. 3A–3F, respectively, taken along lines IV—IV in FIGS. 3.

First, as shown in FIGS. 3A and 4A, a first mask pattern 10 is formed on the upper surface of a material plate 110' (silicon wafer for example). As best shown in FIG. 3A, the first mask pattern 10 covers a central rectangular area (which corresponds to the mirror forming base 111) and a rectangular marginal area (which corresponds to the frame 113). Though not shown in the figures, the first mask pattern 10 may be made by forming a first etching mask layer on the material plate 110', and then patterning this layer.

Figure 3D:
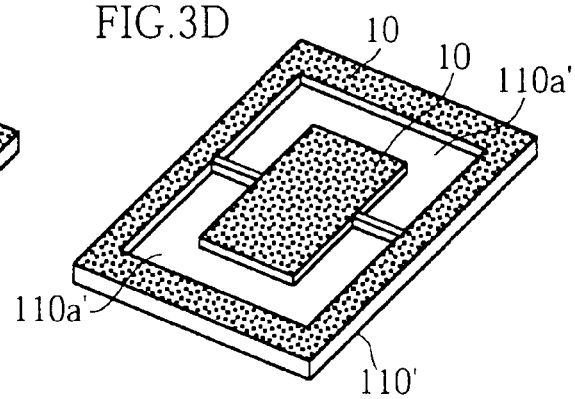
Figure 3B:
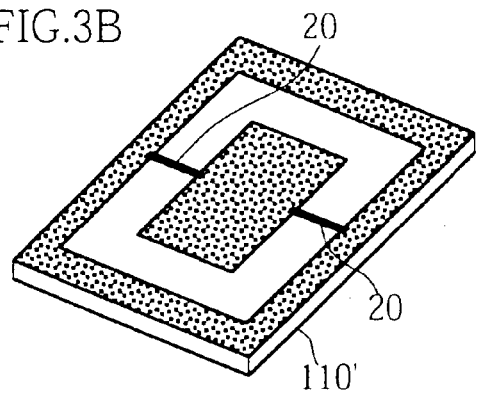
Figure 4B:
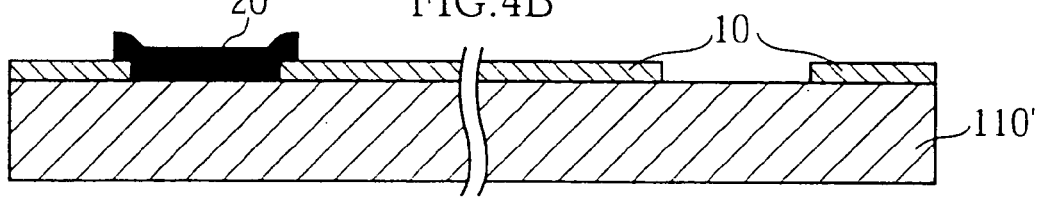
Figure 4C:
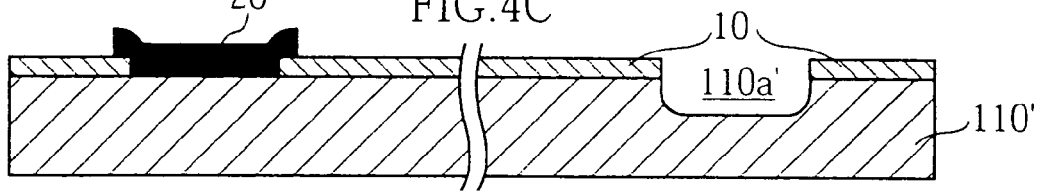

Then, as shown in FIGS. 3B and 4B, a second mask pattern 20 is formed on the material plate 110'. As best shown in FIG. 3B, the second mask pattern 20 covers two aligned but spaced strip areas (which correspond to the torsion bars 112). The second mask pattern 20 may be made by forming a second etching mask layer (not shown) on the plate 110', and then patterning this layer. The second etching mask layer (hence the second mask pattern 20) and the above-mentioned first etching mask layer (hence the first mask pattern 10) are made of different resist materials, so that these two layers exhibit different anti-etching properties.

Then, the material plate 110' with the first and the second mask patterns 10, 20 formed thereon is subjected to a first etching process. The first etching may be performed by Deep RIE (Reactive Ion Etching) or ICP (Inductively Coupled Plasma) etching. Deep RIE and ICP etching are a dry etching method employed frequently for fabrication of e.g. semiconductor devices. Deep RIE and ICP etching are suitable for making deep, narrow grooves due to their anisotropic properties. The first etching is continued until the depth of angular C-shaped grooves 110a' reaches the predetermined value L1 which is smaller than the thickness of the plate 110'. As understood from FIG. 4F, the value L1 is rendered equal to the thickness of the torsion bars 112.

Figure 4D:
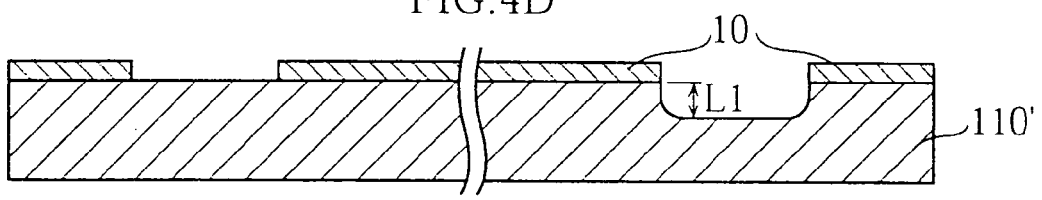

Then, as shown in FIGS. 3D and 4D, the second mask pattern 20 is etched away, while the first mask pattern 10 is left on the plate 110'. In this connection, it should be noted that, as mentioned above, the second mask pattern 20 is made of a resist material exhibiting different anti-etching properties than the first mask pattern 10. Thus, it is possible to achieve such selective mask pattern removal when use is made of an etchant which eats into only the second mask pattern 20 but not the first mask pattern 10.

Figure 3E:
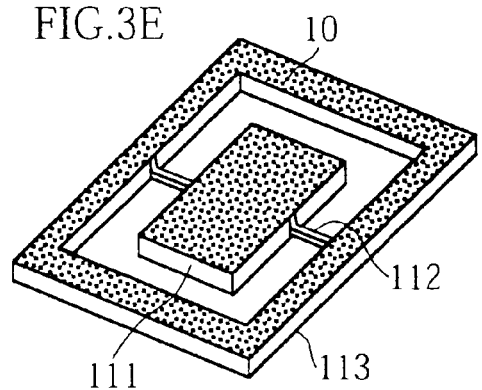
Figure 3C:
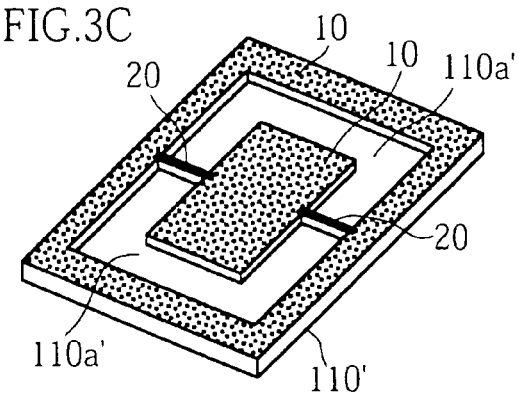
Figure 4E:
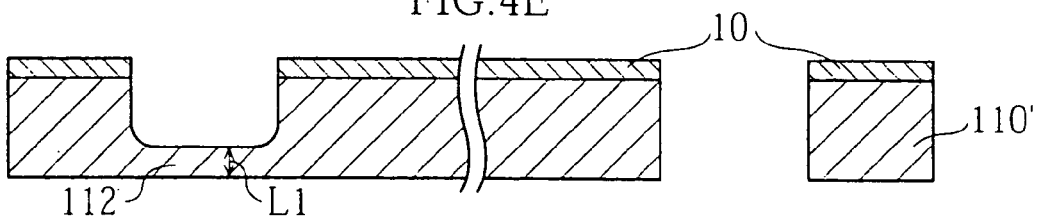

Then, referring to FIGS. 3E and 4E, the material plate 110, which has been formed with the grooves 110a' of L1 depth, is subjected to a second etching process. The etchant used for the second etching process may or may not be the same as the one used for the first etching process. The second etching is continued until the bottoms of the respective C-shaped grooves 110a' are completely eaten away. At this stage, the mirror forming base 111 is supported by the frame 113 via only the torsion bars 112. As shown in FIG. 4E, the resulting torsion bars 112 have a thickness L1 which is equal to the initial depth of the C-shaped grooves 110a' (see FIG. 4D). As seen from FIGS. 4D and 4E, the thickness of the resulting torsion bars 112 is changeable in accordance with the initial depth of the C-shaped grooves 110a'.

Figure 3F:
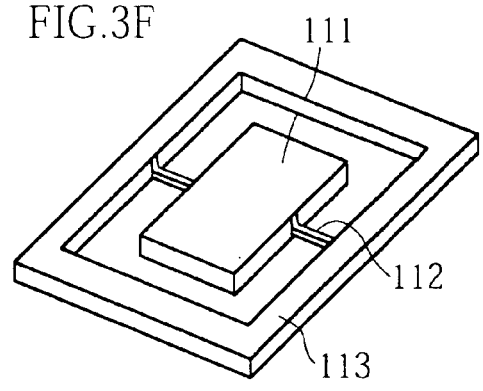
Figure 4F:
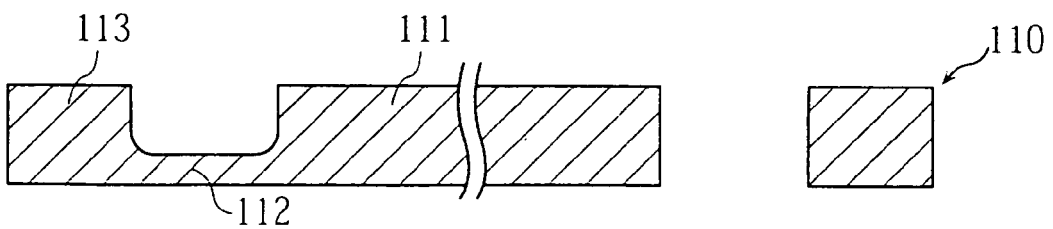

Then, as shown in FIGS. 3F and 4F, the first mask pattern 10 is removed from the plate 110.

Though not shown in FIGS. 3A–3F and 4A–4F, the mirror member 114 and the paired electrodes 115a, 115b (see FIG. 1 or 2) are provided on the material plate 110' before the above-described series of processes are performed. Alternatively, the provision of the mirror member 114 and the electrodes 115a, 115b may come after the above processes. The thus fabricated mirror substrate 110 is stacked on an electrode substrate 120 to produce a complete micromirror unit 100. The electrode substrate 120 may be prepared from a material plate by employing conventional etching and layer-forming techniques.

According to the above-described fabrication method, not only the width but also the thickness of the respective torsion bars 112 are variable. This allows the geometry of each torsion bar 112 to be changed in more various manners than is conventionally possible. Accordingly, compared to the prior art, it is easier to provide each torsion bar 112 with a desired torsional resistance characteristics. Thus, in the micromirror unit 100 shown in FIGS. 1 and 2, the mirror forming base 111 can be rotated accurately through a prescribed angle about the axis of the torsion bars 112, and held in the desired position. Further, in the mirror unit 100, the ends of each torsion bar 112 becomes larger in thickness toward the mirror forming base 111 or frame 113, as shown in FIG. 4E or 4F. Such a structure is advantageous to reducing unfavorable stress concentration at the junction of the torsion bar 112 and the mirror forming base 111 or frame 113.

Still further, in the mirror unit 100 of the present invention, all of the mirror forming base 111, the torsion bars 112 and the frame 113 are made of a conductive material, and formed integral with each other. Thus, as opposed to the prior art micromirror unit, there is no need to provide a conductive line on the torsion bars 112 for charging the electrodes 115a, 115b of the mirror substrate 110.

In the above-described fabrication method, the bottomed groove 110a' (FIG. 4C) is formed when both the first and the second mask patterns 10, 20 are present on the plate 110' (the first etching process). Then, after the second mask pattern 20 is removed (FIGS. 4D–4F), the groove 110a' is turned into a bottomless opening, while the torsion bar 112 is formed (the second etching process). The present invention, however, is not limited to these specific steps. For instance, the bottomless opening shown in FIG. 4E may be formed while the first and the second mask patterns 10, 20 are both present on the plate 110'. After the opening is completed, the second mask pattern 20 is removed (with the first mask pattern 10 unremoved), and then the torsion bars 112 are formed.

Figure 5A:
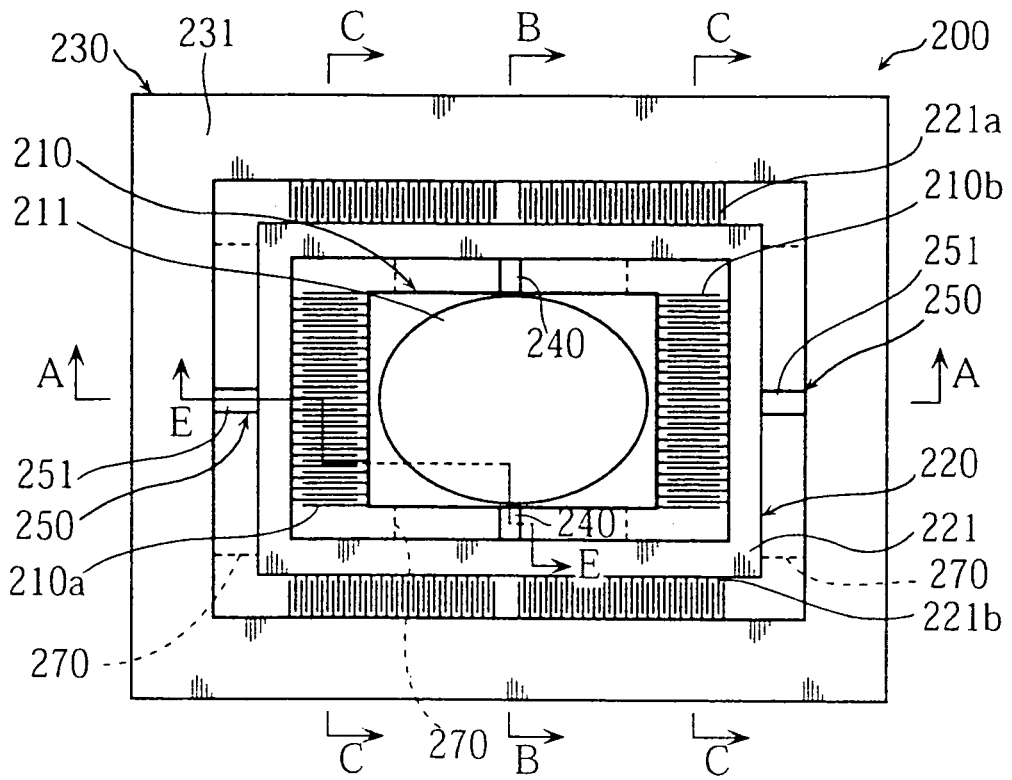
FIGS. 5A and 5B are a plan view and a bottom view showing a micromirror unit according to a second embodiment of the present invention.
Figure 5B:
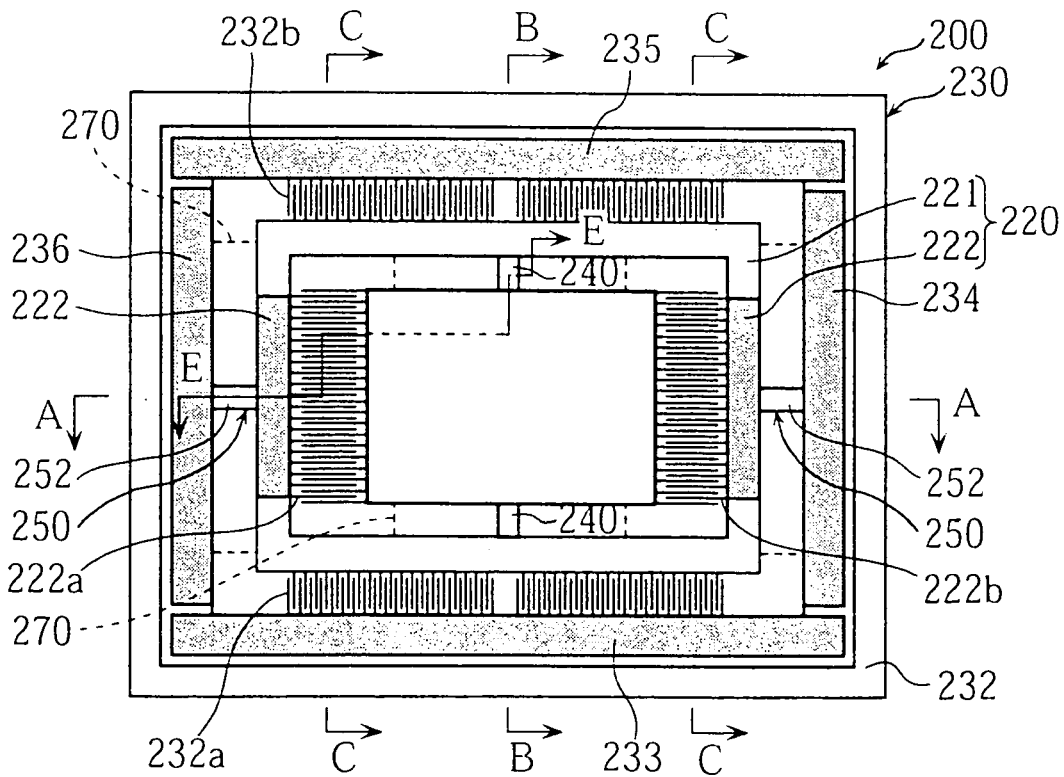

Reference is now made to FIGS. 5A–5B and 6A–6C illustrating a micromirror unit 200 according to a second embodiment of the present invention. FIG. 5A shows the upper side of the unit 200, while FIG. 5B shows the lower side of the unit 200. FIGS. 6A, 6B and 6C are sectional views taken along lines A—A, B—B and C—C in FIGS. 5A–5B, respectively.

As shown in FIGS. 5A and 5B, the micromirror unit 200 of the second embodiment includes a mirror forming base 210, an inner frame 220 surrounding the base 210, an outer frame 230 surrounding the inner frame 220, a pair of first torsion bars 240 connecting the mirror forming base 210 to the inner frame 220, and a pair of second torsion bars 250 connecting the inner frame 220 to the outer frame 230. The first torsion bars 240 have a first common axis (not shown) along which they are elongated. Likewise, the second torsion bars 250 have a second common axis, which is perpendicular to the first common axis. The micromirror unit 200 as a whole is made of a conductive material except for a mirror member 211 and an insulating layer 260 to be described later. The conductive material may be semiconductor (such as silicon) which is doped with n-type impurity (such as phosphorous or arsenic) or p-type impurity (such as boron). In place of the semiconductor, metal such as tungsten may be used.

As shown in FIG. 5A, the mirror forming base 210 is a rectangular plate, having an upper surface upon which a thin reflective layer (mirror member) 211 is provided. Also, the mirror forming base 210 has two relatively long side surfaces and two relatively short side surfaces. The mirror forming base 210 is provided with two sets of first comb-teeth electrodes 210a, 210b extending outward from the shorter side surfaces of the mirror forming base 210.

The inner frame 220, as shown in FIGS. 5B and 6A, includes a frame body 221 and a pair of electrode bases 222. Each of the electrode base 222 is attached to the frame body 221 with an insulating layer 260 intervening therebetween. The electrode bases 222 are provided with second comb-teeth electrodes 222a or 222b extending inward. The frame body 221 is provided with third comb-teeth electrodes 221a, 221b extending outward. As best shown in FIG. 6A, the second comb-teeth electrodes 222a, 222b are disposed under the first comb-teeth electrodes 210a or 210b. In addition, as shown in FIG. 6C, the first comb-teeth electrodes 210a (or 210b) are horizontally offset from the second comb-teeth electrodes 222a (or 222b) so that they will not interfere when the mirror forming base 210 is caused to pivot about the first torsion bars 240. As shown in FIG. 6B, the first torsion bars 240, which are thinner than the mirror forming base 210, connect to the frame body 221 of the inner frame 220.

As best shown in FIGS. 6A–6C, the outer frame 230 includes a first or upper frame member 231, a second or lower frame member 232, a first auxiliary strip (or first island) 233, a second auxiliary strip (or second island) 234, a third auxiliary strip (or third island) 235 and a fourth auxiliary strip (or fourth island) 236. The lower frame member 232 and the auxiliary strips 233–236 are attached to the upper frame member 231 via the insulating layer 260. Such auxiliary strips may be provided on the inner frame 220 or the mirror forming base 210. As shown in FIGS. 6B and 6C, the first auxiliary strip 233 and the third auxiliary strip 235 are provided with fourth comb-teeth electrodes 232a or 232b extending inward. The fourth comb-teeth electrodes 232a and 232b are disposed under the third comb-teeth electrodes 221a or 221b of the inner frame body 221. The third electrodes and the fourth electrodes are horizontally offset so that they will not interfere when the inner frame 220 is caused to pivot about the second torsion bars 250. As shown in FIG. 6A, each of the second torsion bars 250 includes an upper half 251 and a lower half 252 which is attached to the upper half 251 via the insulating layer 260. The upper half 251 connects the inner frame body 221 to the upper frame member 231, while the lower half 252 connects the electrode base 222 to the second or fourth auxiliary strip 234 or 236.

In the illustrated embodiment, when a potential is applied to the upper frame member 231, the effect is conducted to the first comb-teeth electrodes 210a–210b and the third comb-teeth electrodes 221a–221b via the upper half 251 of the second torsion bars 250, the inner frame body 221, the first torsion bars 240 and the mirror forming base 210. As a result, the first comb-teeth electrodes 210a, 210b and the third comb-teeth electrodes 221a, 221b are held at the same potential. In this state, when the second comb-teeth electrodes 222a, 222b are charged to a desired potential, an electrostatic force is generated between the first comb-teeth electrodes 210a or 210b and the second comb-teeth electrodes 222a or 222b. As a result, the mirror forming base 210 is turned about the first torsion bars 240. Likewise, when the fourth comb-teeth electrodes 232a, 232b are charged to a desired potential, an electrostatic force is generated between the third comb-teeth electrodes 221a or 221b and the fourth comb-teeth electrodes 232a or 232b. As a result, the inner frame 220 together with the mirror forming base 210 is turned about the second torsion bars 250.

As seen from FIG. 6A, the application of potential to the second comb-teeth electrodes 222a is performed through the fourth auxiliary strip 236, the lower half 252 of the torsion bar 250 connected to the strip 236 and the relevant one of the electrode bases 222. Likewise, the application of potential to the second comb-teeth electrodes 222b is performed through the second auxiliary strip 234, the lower half 252 of the torsion bar 250 connected to the strip 234 and the relevant one of the electrode bases 222. As seen from FIG. 6B, the application of potential to the fourth comb-teeth electrodes 232a is performed through the first auxiliary strip 233. Likewise, the application of potential to the fourth comb-teeth electrodes 232b is performed through the third auxiliary strip 235. Since the four auxiliary strips are electrically insulated from each other, required potential can be applied selectively to the second comb-teeth electrodes 222a, 222b or the fourth comb-teeth electrodes 232a, 232b. Accordingly, the mirror forming base 210 and hence the mirror member 211 can be directed in a desired direction.

Referring now to FIGS. 7A–7M, a fabrication process of the micromirror unit 200 will be described below. The sectional views of the figures are taken along lines E—E in FIG. 5A or 5B.

First, as shown in FIG. 7A, two conductive plates 200' are prepared. These plates may be a silicon wafer doped with n-type impurity such as arsenic or p-type impurity such as boron. Preferably, the doped wafer may have a resistivity of 0.01–0.1 Ω·cm. Each of the conductive plates 200' has its upper surface covered by a silicon dioxide layer 260 of 500 nm thickness. This layer may be formed by thermal oxidation.

Then, as shown in FIG. 7B, the two plates 200' are fixed to each other with their silicon dioxide layers 260 held in contact. The fixation may be achieved by annealing under nitrogen atmosphere with an annealing temperature of about 1100° C. Thereafter, the attached plates 200' are subjected to grinding so that each of them has a thickness of 100 μm. As a result, an SOI (Silicon on Insulator) assembly is obtained, which consists of the upper Si layer 201a (100 μm in thickness), the SiO2 insulator 260' (1 μm in thickness) and the lower Si layer 201b (100 μm in thickness).

Then, as shown in FIG. 7C, the exposed surface of the upper Si layer 201a is covered by a silicon dioxide layer 30' to produce a first etching mask. The thickness of the layer 30' may be 100–1000 nm. At this stage, though not shown in the figure, the exposed surface of the lower Si layer 201b may also be covered by the same SiO2 layer. As is obvious to the person skilled in the art, the layer 30' may be made of other materials than silicon dioxide, as long as the alternative material can serve proper masking function when the Si layer 201a is subjected to the etching processes (FIGS. 7F and 7H) by Deep RIE. The layer forming technique may be thermal oxidation, CVD (chemical vapor deposition), etc.

Then, as shown in FIG. 7D, the SiO2 layer 30' is etched away at the prescribed portions to provide a first mask 30. The patterning for the mask 30 is performed with the use of a first mask pattern 40 shown in FIG. 8A. The configuration of the first mask pattern 40 corresponds to the layout of the principal components of the micromirror unit 200, such as the mirror forming base 210, the first comb-teeth electrodes 210a–210b, the inner frame body 221, the third comb-teeth electrodes 221a–221b, and the upper frame member 231 of the outer frame 230. The patterning of the layer 30' may be performed by wet etching (using hydrogen fluoride solution) or dry etching (using CHF3 gas, C4F8 gas, etc.).

Then, as shown in FIG. 7E, a second mask 50 is formed on the upper Si layer 201a. To this end, though not shown in the figure, a photoresist layer, from which the mask 50 is produced, is formed on the upper Si layer 201' and then etched into the prescribed pattern. The thickness of the photoresist layer may be 0.5–50 μm. Use may be made of an Si3N4 layer in place of the photoresist layer. The layer forming method may be thermal oxidation or CVD for example. The etching of the photoresist layer is performed with the use of a second mask pattern 60 shown in FIG. 8B. The configuration of the second mask pattern 60 corresponds to the first torsion bars 240, the upper half 251 of each second torsion bar 250, and support beams 270. As readily understood, care should be taken to ensure that the etching using the second mask pattern 60 will be performed in a manner such that the first mask pattern 30 remains intact. According to the present invention, the support beams 270 are provided for alleviating stress concentration at the first and the second torsion bars 240 or 250 in the midst of fabricating the micromirror unit. In the illustrated embodiment, as shown in FIGS. 5A and 5B, the support beams 270 connect the inner frame 220 to the mirror forming base 210, or connect the outer frame 230 to the inner frame 220. The support beams 270 are provisional bridges to be removed at a latter step before a complete micromirror unit is obtained.

Then, as shown in FIG. 7F, the upper Si plate 201a is subjected to a first etching process by Deep RIE using SF6gas and C4F8 gas. This first etching is continued until a predetermined etching depth (say, 5 μm) is achieved in the surface of the upper Si plate 201a. Instead of the Deep RIE, wet etching using KOH solution may be employed.

Then, as shown in FIG. 7G, the second mask pattern 50 is removed by the application of an organic solvent or by exposure to oxygen plasma. The organic solvent should be reactive on the second mask pattern 50 but (substantially) nonreactive on the first mask pattern 30. Examples of such organic solvent are tripropylene glycol methyl ether, aminoethyl ethanolamine, phosphoric acid aqueous solution, or a mixture of monoethanolamine and dimethyl sulfoxide. For instance, when the first mask pattern 30 is made of SiO2 and the second mask pattern 50 is made of Si3N4, use may be made of phosphoric acid aqueous solution for the selective removal of the second mask pattern 50.

Then, as shown in FIG. 7H, a second etching process is performed, with only the first mask pattern 30 present, by Deep RIE using SF6 gas and C4F8 gas. This etching process is continued until an etching depth of 95 μm is achieved in the upper Si plate 201a. If necessary, an over-etching is carried out for an additional depth (e.g. 1 μm) to compensate for a processing error.

With the above described steps, the upper Si plate 201a is formed with components or elements which correspond to the mirror forming base 210 of the micromirror unit 200, the first comb-teeth electrodes 210a–210b, the inner frame body 221, the third comb-teeth electrodes 221a–221b, the upper frame member 231, the first torsion bars 240, the upper halves 251 of the second torsion bars 250, and the support beams 270. Since the second etching process is performed by Deep RIE, the upper halves 251 of the second torsion bars have a nonrectangular, round corner at the junctures to the neighboring components, as shown in FIG. 7H.

Figure 7I:
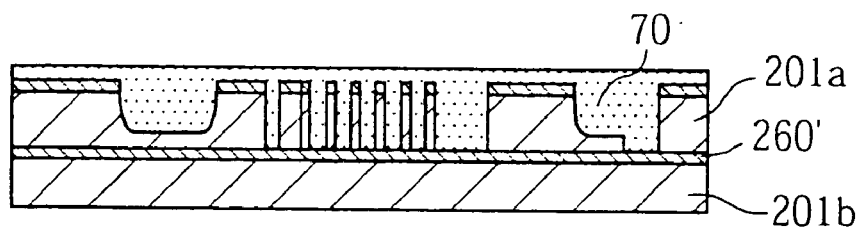
Figure 8A:
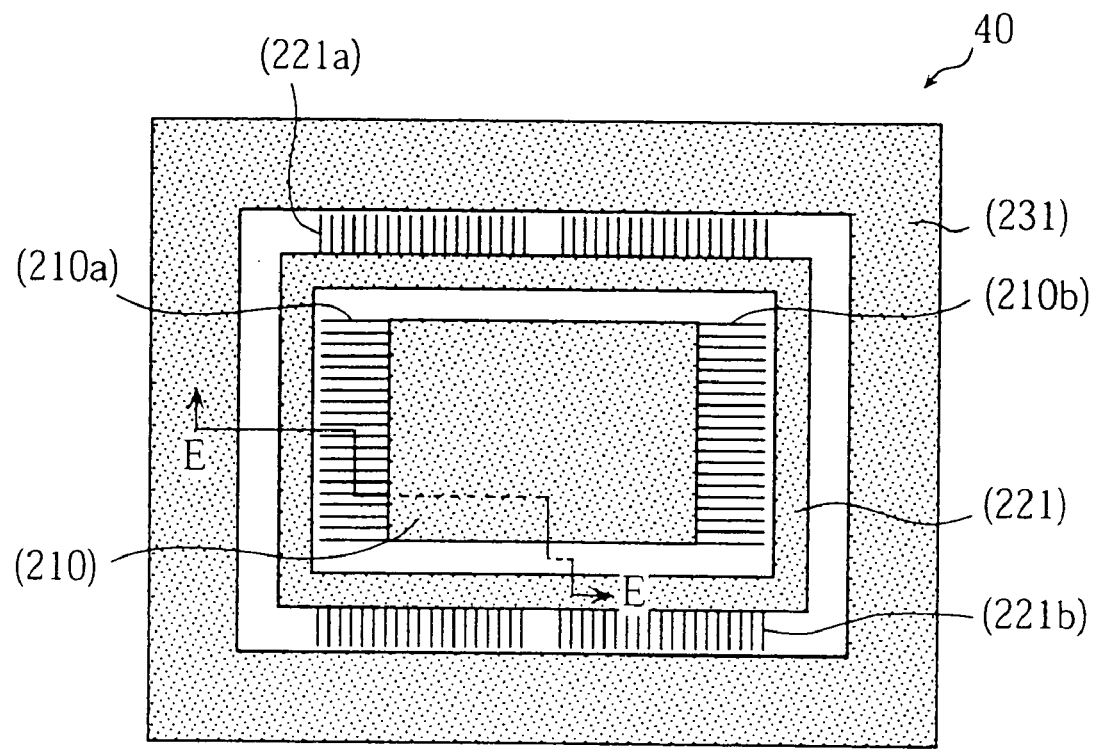
FIGS. 8A and 8B are plan views showing masks configured to make first and second mask patterns used in the fabrication process of FIG. 7.
Figure 8B:
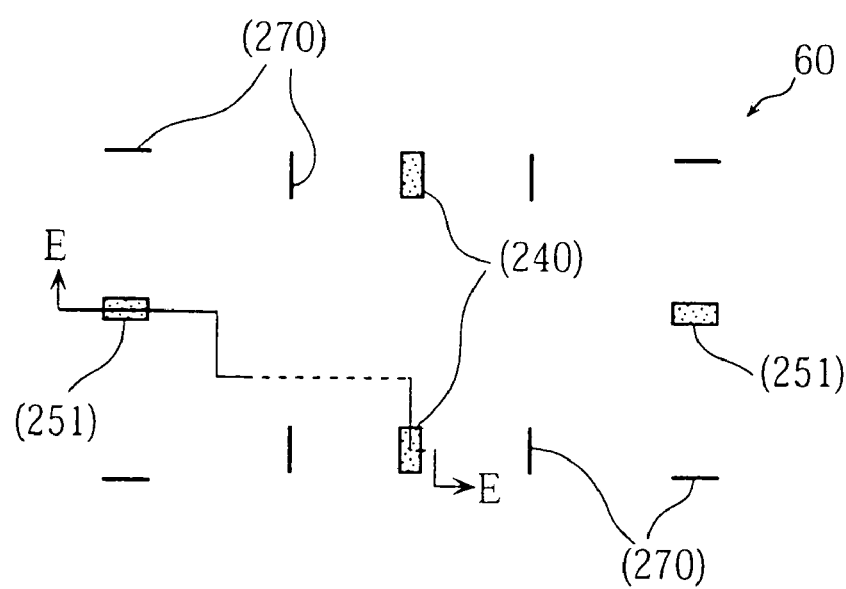

Following the second etching step shown in FIG. 7H, a protection coating forming step is carried out, as shown in FIG. 7I. The protection coating 70 encloses the components formed in the upper Si plate 201a, so that these components will not be broken during the subsequent steps of the fabrication procedure. The protection coating 70 may be formed by applying molten glass to the upper plate 201a and then annealing the glass material. Instead of a glass material, a commercially available resist material such as AZ or TSCR may be applied to the upper Si plate 201a to form a protection coating. It is also possible to stick a film sheet to the plate 201a. In light of the control ability of adhesion timing, the film sheet may preferably be made of a UV material which cures upon exposure to ultraviolet light.

After the protection coating 70 is formed, the lower Si plate 201b is processed in the following manner.

Figure 9A:
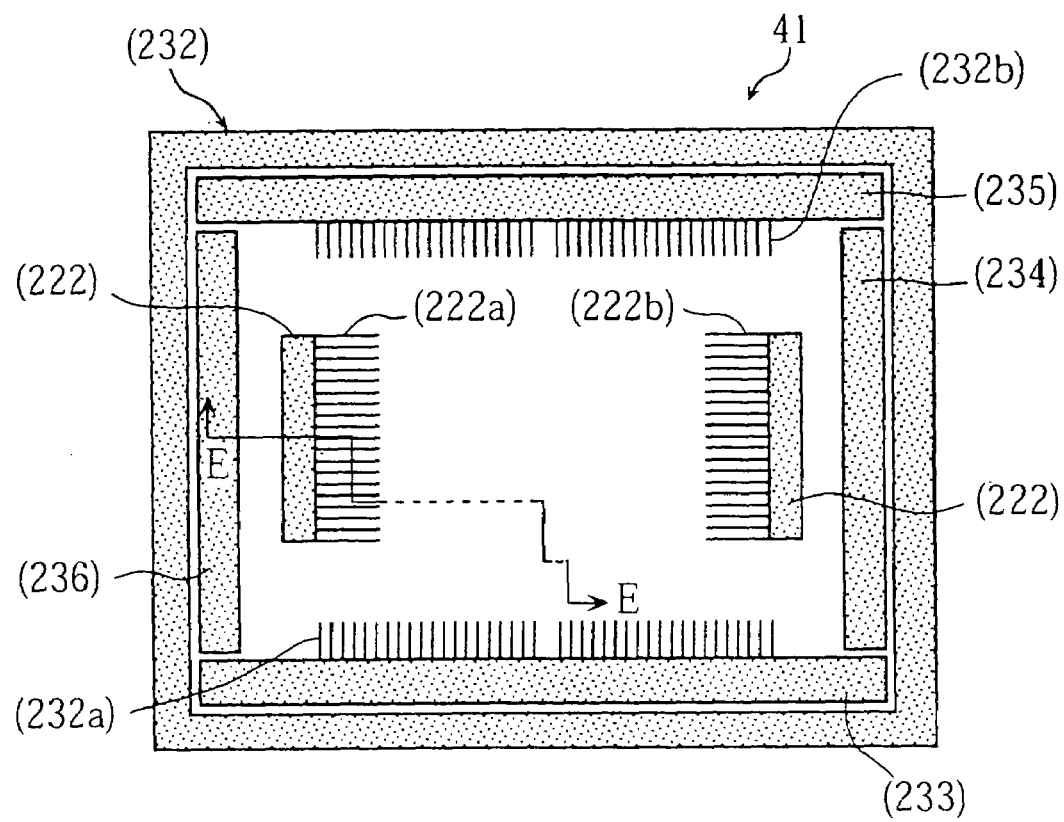
FIGS. 9A and 9B are plan views showing masks configured to make third and fourth mask patterns used in the fabrication process of FIG. 7.
Figure 9B:
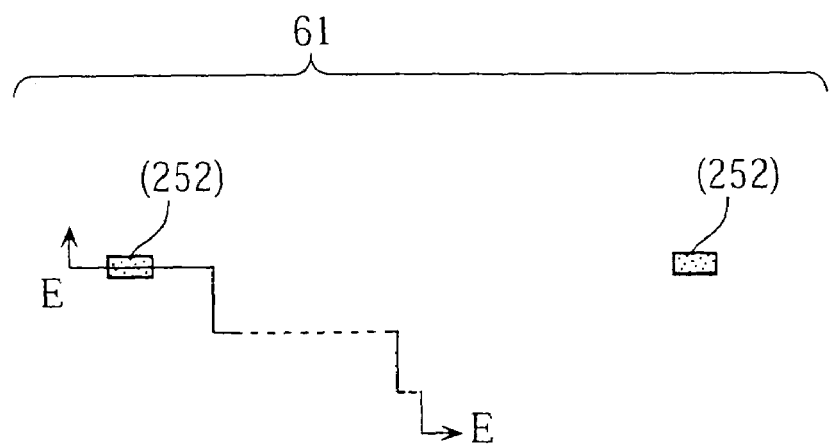
Figure 10:
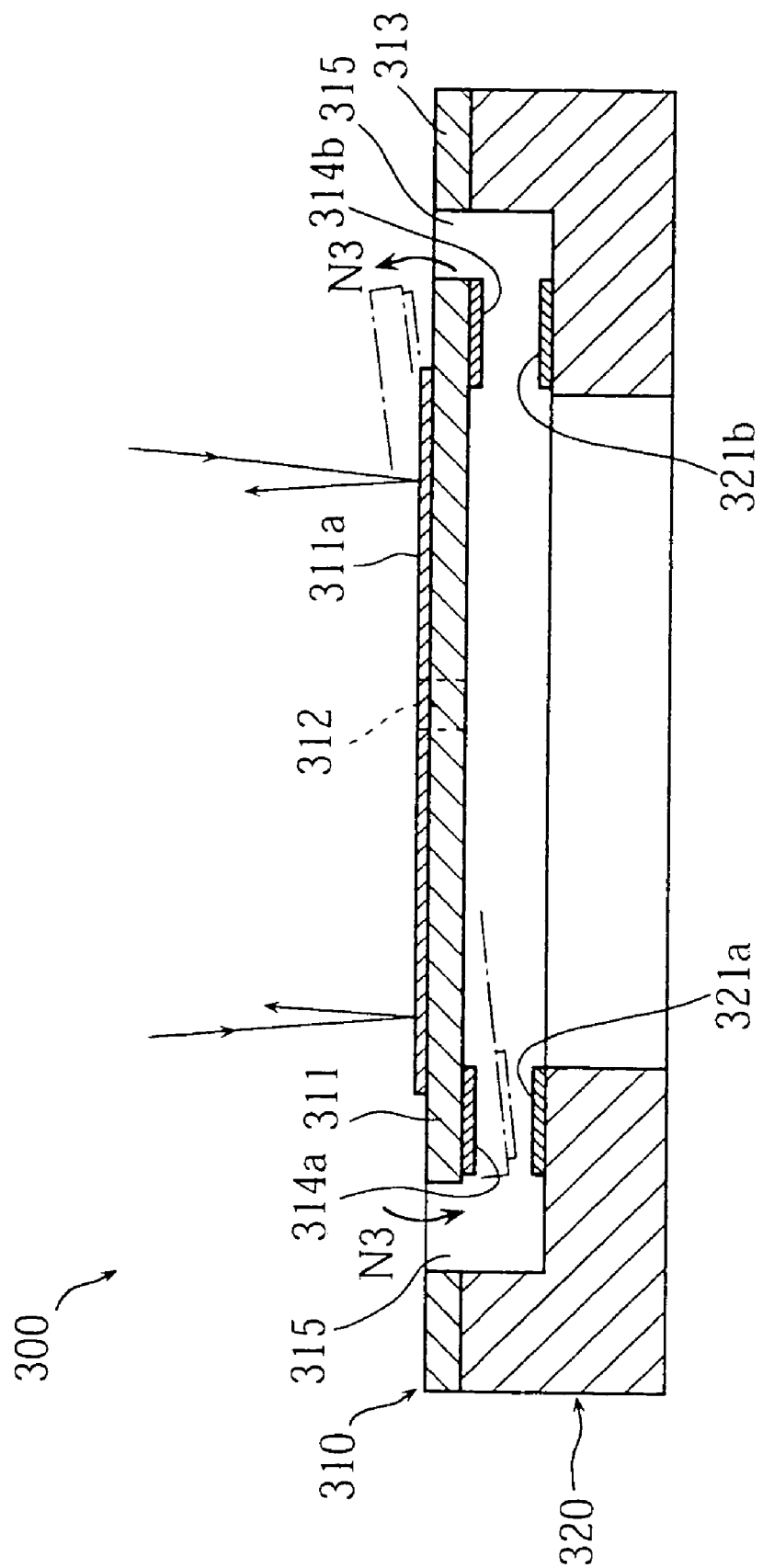
FIG. 10 is a sectional view showing a conventional micromirror unit.
Figure 11:
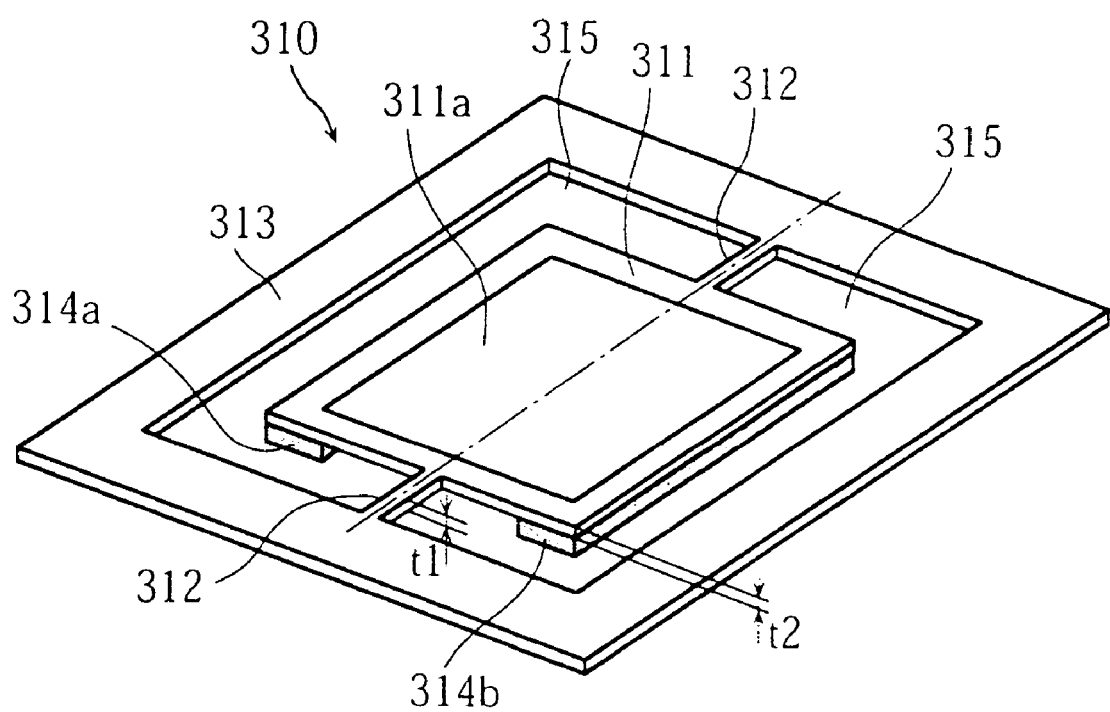
FIG. 11 is a perspective view illustrating the mirror substrate shown in FIG. 10.

First, though not shown in the figures, a third etching mask layer is formed on the exposed surface (lower surface in FIG. 7J) of the lower Si plate 201b. The third etching mask layer is made of silicon dioxide and has a thickness of 100–1000 nm. Then, the third layer is etched to provide a third mask pattern 31. This etching is performed with the use of a third mask 41 shown in FIG. 9A. The configuration of the third mask 41 corresponds to the paired electrode bases 222, the second comb-teeth electrodes 222a–222b, the first through the fourth auxiliary strips 233–236, and the fourth comb-teeth electrodes 232a–232b.

Figure 7J:
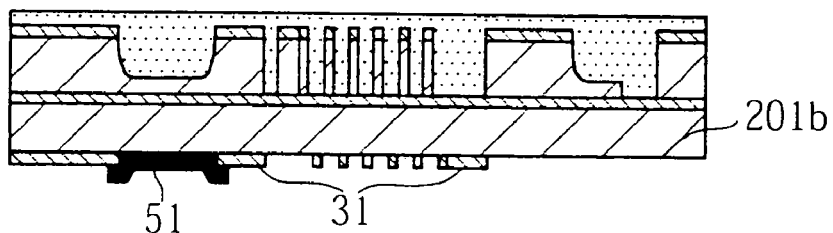

Then, as shown in FIG. 7J, a fourth mask pattern 51 is formed on the lower Si plate 201b. The fourth mask pattern 51 is made by forming a fourth etching mask layer (photoresist layer) on the lower Si plate 201b, and then etching this layer into the predetermined pattern. The thickness of the fourth etching mask layer may be 0.5–50 μm.

Figure 7K:
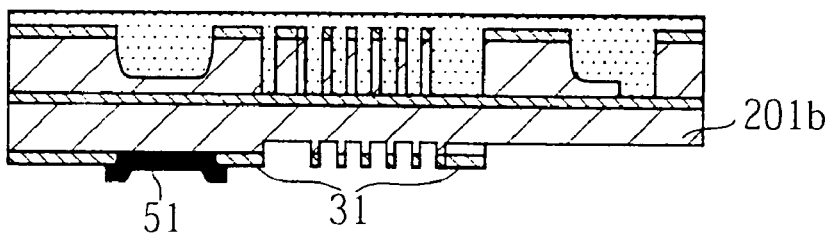

Then, as shown in FIG. 7K, the lower Si plate 201b is subjected to a first etching process. The first etching is performed by Deep RIE with the use of SF6 gas and C4F8 gas. The etching process is continued until a desired etching depth (say 5 μm) is attained.

Figure 7L:
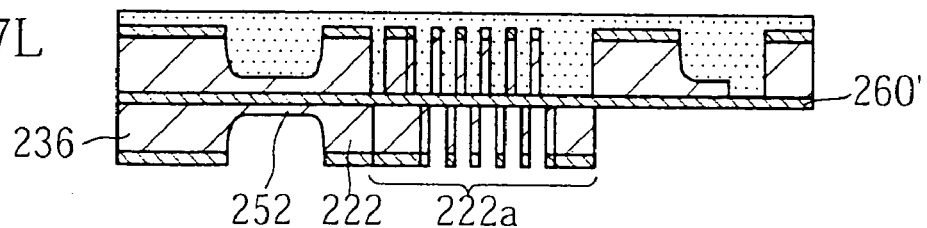

Then, the fourth mask pattern 51 is removed by the application of an organic solvent or by exposure to oxygen plasma, while the third mask pattern 31 remains intact. Thereafter, as shown in FIG. 7L, the lower Si plate 201b is subjected to a second etching process. The second etching is performed by Deep RIE using SF6 gas and C4F8 gas, and is continued until a desired etching depth (say 95 μm) is attained. If necessary, an over-etching is carried out for an additional depth (e.g. 1 μm) to compensate for a processing error.

With the above steps, the lower Si plate 201b is formed with components or elements which correspond to the electrode bases 222, the second comb-teeth electrodes 222a–222b, the lower frame member 232 of the outer frame 230, the fourth comb-teeth electrodes 232a–232b, and the lower halves 252 of the second torsion bars 250.

Figure 7M:
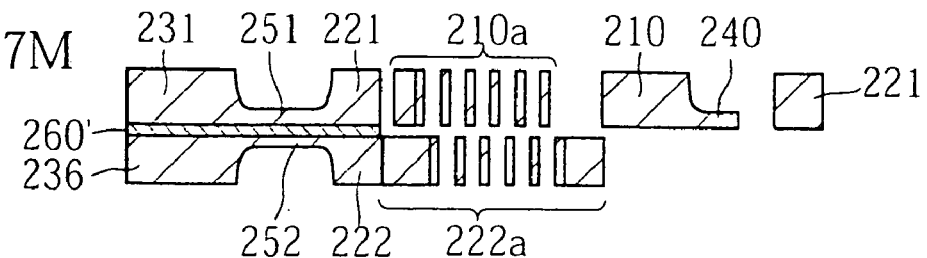

Then, the first mask pattern 30, the third mask pattern 31 and the prescribed portions of the insulating layer 260 are removed by wet etching for example. Thus, the processed plate assembly as shown in FIG. 7M is obtained. Thereafter, though not shown in the figures, a micromirror unit is cut out from the processed plate assembly, with the support beams 270 unremoved. The removal of the support beams 270 may be performed thermally or mechanically. For example, each support beam 270 is formed with a cut at a prescribed portion by irradiating laser beams, and then is blown away. Instead, an electric current may be caused to pass through the support beam 270, to generate Joule heat for melting the support beam.

In the fabrication method described above, the mirror member 211 may be formed before the first step shown in FIG. 7A is initiated. The mirror member 211 may be made in the following manner. First, a titanium layer (50 nm in thickness) is formed in a prescribed area corresponding to the resulting mirror forming base 210. Then, a gold layer (500 nm in thickness) is formed on the titanium layer. Finally, the titanium-gold layer assembly is subjected to etching to be made into a prescribed configuration. The thus obtained mirror member 211 is reflective and electrically conductive. Therefore, electrical connection to the support plate (typically silicon wafer) can be made via the mirror member 211. Thus, if necessary, a connection wire can be bonded to the mirror member 211.

According to the present invention, there may be provided a micromirror unit and a fabrication method of a micromirror unit. The ideas of present invention can be expressed in the following inducements.

[Inducement 1] A fabrication method is provided for making a micromirror unit which includes a frame, a mirror forming base, and bridges connecting the frame to the mirror forming base. The bridges include torsion bars disposed between the frame and the mirror forming base. The fabrication method comprises the steps of:

forming a first mask pattern on a substrate for masking portions of the substrate which are processed into the frame and the mirror forming base;

forming a second mask pattern on the substrate for masking portions of the substrate which are processed into the bridges;

subjecting the substrate to a first etching process with the first and the second mask patterns present;

removing the second mask pattern;

subjecting the substrate to a second etching process with the first mask pattern present; and removing the first mask pattern.

[Inducement 2] The fabrication method according to Inducement 1, wherein the bridges also include support beams in addition to the torsion bars.

[Inducement 3] The fabrication method according to Inducement 1 or 2, wherein the first etching process is continued until material removal progresses halfway into the substrate in the thickness direction of the substrate, and the second etching progress is performed for material removal, so that the frame and the mirror forming base are connected to each other via the bridges only.

[Inducement 4] The fabrication method according to Inducement 1 or 2, wherein the first etching process is performed for completely removing portions of the substrate which are not masked by the first and the second mask patters, and the second etching process is performed for material removal until the bridges are formed.

[Inducement 5] The fabrication method according to any one of Inducements 1–4, wherein the respective steps are performed with respect to the obverse and the reverse surfaces of the substrate.

[Inducement 6] The fabrication method according to any one of Inducements 1–5, wherein the first and/or the second etching process employ dry etching.

[Inducement 7] The fabrication method according to Inducement 6, wherein the first and/or the second etching process employ Deep RIE.

[Inducement 8] A micromirror unit is provided, which includes a first frame, a mirror forming base, and a first torsion bar connecting the frame to the mirror forming base, wherein the frame, the mirror forming base and the torsion bar are formed as a one-piece component by a common conductive material.

[Inducement 9] The micromirror unit according to Inducement 8, wherein the torsion bar has a first end portion connected to the frame, and the first end portion becomes progressively greater in thickness toward the frame.

[Inducement 10] The micromirror unit according to Inducement 8 or 9, wherein the torsion bar has a second end portion connected to the mirror forming base, and the second end portion becomes progressively greater in thickness toward the mirror forming base.

[Inducement 11] The micromirror unit according to any one of Inducements 8–10, wherein the mirror forming base is provided with first comb-teeth electrodes, and the frame is provided with second comb-teeth electrodes for generating electrostatic force in cooperation with the first comb-teeth electrodes to move the mirror forming base.

[Inducement 12] The micromirror unit according to Inducement 11, wherein the first comb-teeth electrodes are accommodated in a space equal in thickness to the mirror forming base, and the second comb-teeth electrodes are accommodated in a space equal in thickness to the frame.

[Inducement 13] The micromirror unit according to any one of Inducements 8–12, further including a counterpart base facing the mirror forming base, wherein the counterpart base is provided with a first flat electrode facing the mirror forming base.

[Inducement 14] The micromirror unit according to Inducement 13, wherein the mirror forming base is provided with a second flat electrode facing the first flat electrode on the counterpart base.

[Inducement 15] The micromirror unit according to any one of Inducements 8–14, further including a second frame arranged outward of the first frame and a second torsion bar connecting the second frame to the first frame, wherein the second torsion bar is elongated in a direction perpendicular to another direction in which the first torsion bar is elongated.

[Inducement 16] The micromirror unit according to Inducement 15, wherein the first frame is provided with third comb-teeth electrodes, and the second frame is provided with fourth comb-teeth electrodes for generating electrostatic force in cooperation with the third comb-teeth electrodes to move the first frame.

[Inducement 17] The micromirror unit according to any one of Inducements 8–16, wherein each frame includes a first conductive layer, a second conductive layer and an insulating layer sandwiched between the first and the second conductive layers.

[Inducement 18] The micromirror unit according to any one of Inducements 8–17, wherein the mirror forming base includes a plurality of conductive layers and an insulating layer inserted between the conductive layers.

[Inducement 19] The micromirror unit according to any one of Inducements 8–18, wherein the first or second torsion bar includes a plurality of conductive layers and an insulating layer inserted between the conductive layers.

[Inducement 20] The micromirror unit according to any one of Inducements 8–19, further including a plurality of islands insulated from each other by an insulating layer or clearance.

These islands may be attached to the first or second frame or the mirror forming base.

According to the present invention, it is possible to form a torsion bar which is different in thickness from the mirror forming base. This helps to increase the freedom of the torsion bar designing in a micromirror unit. Accordingly, it is possible to provide a torsion bar which is suitably configured to allow the mirror forming base to turn in a desired manner. Further, according to the present invention, the mirror forming base, the torsion bars and the frame may be made of the same conductive material. In this manner, the potential application to the mirror forming base can be achieved through the torsion bars, and therefore there is no need to lay a separate current passage extending along the surface of the torsion bar and further onto the mirror forming base.

The present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

The invention claimed is:

1. A micromirror unit comprising:
    a first frame;
    a mirror forming base; and
    a first torsion bar connecting the frame to the mirror forming base;
    wherein the frame, the mirror forming base and the torsion bar are formed as a one-piece component by a common conductive material; and
    wherein the torsion bar has a first end portion connected to the frame and a second end portion connected to the mirror forming base, the first end portion being made progressively greater in thickness toward the frame, the second end portion being made progressively greater in thickness toward the mirror forming base.

2. The micromirror unit according to claim 1, wherein the mirror forming base is provided with first comb-teeth electrodes, the frame being provided with second comb-teeth electrodes for generating electrostatic force in cooperation with the first comb-teeth electrodes to move the mirror forming base.

3. The micromirror unit according to claim 1, further comprising a counterpart base facing the mirror forming base, the counterpart base being provided with a flat electrode facing the mirror forming base.

4. The micromirror unit according to claim 1, further comprising a second frame disposed outward of the first frame and a second torsion bar connecting the second frame to the first frame, the second torsion bar being elongated in a direction perpendicular to another direction in which the first torsion bar is elongated.

5. A micro pivoting unit comprising:
a first frame;
a pivotable base; and
a first torsion bar connecting the frame to the pivotable base;
wherein the frame, the pivotable base and the torsion bar are formed as a one-piece component by a common conductive material; and
wherein the torsion bar has at least one portion that varies in thickness while extending between the frame and the pivotal base.

6. The micro pivoting unit according to claim 5, wherein the torsion bar has a first end portion connected to the frame and a second end portion connected to the pivotable base, the fist end portion being made progressively greater in thickness toward the frame, the second end portion being made progressively greater in thickness toward the pivotable base.

7. The micro pivoting unit according to claim 5, wherein the pivotable base is provided with first comb-teeth electrodes, the frame being provided with second comb-teeth electrodes for generating electrostatic force in cooperation with the first comb-teeth electrodes to pivot the pivotable base about a first pivotal axis provided by the first torsion bar.

8. The micro pivoting unit according to claim 5, further comprising a counterpart base facing the pivotable base, the counterpart base being provided with a flat electrode facing the pivotable base.

9. The micro pivoting unit according to claim 5, further comprising a second frame disposed outward of the first frame and a second torsion bar connecting the second frame to the first frame, the second torsion bar providing a second pivotal axis perpendicular to a first pivotal axis provided by the first torsion bar.

* * * * *